United States Patent
Ito et al.

(10) Patent No.: US 9,845,175 B2
(45) Date of Patent: Dec. 19, 2017

(54) POLYLACTIC ACID FORMED BODY HAVING A VAPOR-DEPOSITED FILM AND METHOD OF PRODUCING THE SAME

(71) Applicant: TOYO SEIKAN GROUP HOLDINGS, LTD., Shinagawa-ku, Tokyo (JP)

(72) Inventors: Takuro Ito, Yokohama (JP); Satomi Ozawa, Yokohama (JP); Satoru Kito, Yokohama (JP); Kazuhiko Yamazaki, Yokohama (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 660 days.

(21) Appl. No.: 14/382,845

(22) PCT Filed: Feb. 4, 2013

(86) PCT No.: PCT/JP2013/052441
§ 371 (c)(1),
(2) Date: Sep. 4, 2014

(87) PCT Pub. No.: WO2013/140868
PCT Pub. Date: Sep. 26, 2013

(65) Prior Publication Data
US 2015/0030792 A1    Jan. 29, 2015

(30) Foreign Application Priority Data

Mar. 21, 2012   (JP) ................................. 2012-063241

(51) Int. Cl.
*B65D 23/08*   (2006.01)
*B65D 1/02*    (2006.01)
(Continued)

(52) U.S. Cl.
CPC ....... *B65D 23/0807* (2013.01); *B65D 1/0215* (2013.01); *B65D 23/02* (2013.01);
(Continued)

(58) Field of Classification Search
CPC .. B65D 23/0807; B65D 23/02; B65D 1/0215; C08J 7/123; C23C 16/26; C23C 16/27; C23C 16/511
See application file for complete search history.

(56) References Cited

U.S. PATENT DOCUMENTS

2002/0179603 A1   12/2002   Darras et al.
2005/0271846 A1   12/2005   Suzuki
(Continued)

FOREIGN PATENT DOCUMENTS

CN    101031669 A    9/2007
CN    101678642 A    3/2010
(Continued)

OTHER PUBLICATIONS

International Search Report for PCT/JP2013/052441 dated Apr. 16, 2013.
(Continued)

*Primary Examiner* — John Uselding
(74) *Attorney, Agent, or Firm* — Sughrue Mion, PLLC (57) ABSTRACT

A polylactic acid formed body including a polylactic acid base material (1) and a hydrocarbon film (3) vapor-deposited on the surface of the base material by a plasma CVD method. The polylactic acid base material (1) exhibits a sharp X-ray diffraction peak in which a half-width of peak appearing in the 10°-25° wide angle X-ray measurement is not more than 1.22°, and the hydrocarbon film (3) is vapor-deposited on the surface of the polylactic acid base material (1), and includes two layers of a high $CH_2$ layer (3a) having a ratio of $CH_2$ per the total of CH, $CH_2$ and $CH_3$ of
(Continued)

not less than 40% and a low $CH_2$ layer (3b) formed on the high $CH_2$ layer (3a) and having a ratio of $CH_2$ per the total of CH, $CH_2$ and $CH_3$ of not more than 35%.

9 Claims, 3 Drawing Sheets

(51) Int. Cl.

| | |
|---|---|
| C23C 16/27 | (2006.01) |
| C08J 7/12 | (2006.01) |
| B65D 23/02 | (2006.01) |
| C23C 16/26 | (2006.01) |
| C23C 16/511 | (2006.01) |
| B05D 7/04 | (2006.01) |
| B05D 7/00 | (2006.01) |
| B05D 1/00 | (2006.01) |
| B65D 65/46 | (2006.01) |

(52) U.S. Cl.
CPC ............ *C08J 7/123* (2013.01); *C23C 16/26* (2013.01); *C23C 16/27* (2013.01); *C23C 16/511* (2013.01); *B05D 1/62* (2013.01); *B05D 7/04* (2013.01); *B05D 7/50* (2013.01); *B05D 2490/50* (2013.01); *B65D 65/466* (2013.01); *C08J 2367/04* (2013.01); *Y02W 90/12* (2015.05); *Y10T 428/1379* (2015.01); *Y10T 428/24975* (2015.01); *Y10T 428/31786* (2015.04)

(56) References Cited

U.S. PATENT DOCUMENTS

| | | |
|---|---|---|
| 2008/0095954 A1 | 4/2008 | Gabelnick et al. |
| 2010/0112252 A1 | 5/2010 | Ito et al. |
| 2010/0200587 A1 | 8/2010 | Ito et al. |
| 2011/0097528 A1 | 4/2011 | Dippel et al. |

FOREIGN PATENT DOCUMENTS

| | | |
|---|---|---|
| CN | 101815749 A | 8/2010 |
| EP | 2151395 A1 | 2/2010 |
| JP | 2001-018290 A | 1/2001 |
| JP | 2002-274521 A | 9/2002 |
| JP | 2005-014966 A | 1/2005 |
| JP | 2007-261077 A | 10/2007 |
| JP | 2008-69407 A | 3/2008 |
| JP | 2009-083511 A | 4/2009 |
| JP | 2009-234057 A | 10/2009 |

OTHER PUBLICATIONS

Communication dated Feb. 19, 2015 from the European Patent Office in counterpart application No. 13763941.5.

X-RAY DIFFRACTION CHART OF
A POLYLACTIC ACID BASE MATERIAL

POLYLACTIC ACID FORMED BODY HAVING A VAPOR-DEPOSITED FILM AND METHOD OF PRODUCING THE SAME

CROSS REFERENCE TO RELATED APPLICATIONS

This application is a National Stage of International Application No. PCT/JP2013/052441 filed Feb. 4, 2013, claiming priority based on Japanese Patent Application No. 2012-063241 filed Mar. 21, 2012, the contents of all of which are incorporated herein by reference in their entirety.

TECHNICAL FIELD

This invention relates to a polylactic acid formed body having a vapor-deposited film. More specifically, the invention relates to a polylactic acid formed body (specifically, bottle) having a hydrocarbon film vapor-deposited on the surface thereof by a plasma CVD method and to a method of producing the same.

BACKGROUND ART

To improve properties of various base materials, so far, it was an accepted practice to vapor-deposit a film on their surfaces by the plasma CVD method. In the field of packing materials, it is a known art to vapor-deposit a film on the plastic base materials such as of containers by the plasma CVD method to improve gas-barrier property. For example, attempts have been made to improve gas-barrier property by vapor-depositing a film of silicon oxide on the surfaces of plastic containers such as polyethylene terephthalate (PET) bottles by the plasma CVD method by using a mixed gas of an organosilicon compound and oxygen as a reaction gas.

In recent years, however, from the standpoint of environmental problems, attention has been given to the polylactic acid which is a representative biodegradable plastic material in a variety of fields, and bottles made from the polylactic acid have been put into practical use in the field of packing materials, too. The polylactic acid bottles, however, have gas-barrier property inferior to that of the PET bottles. Therefore, attempts have been made to vapor-deposit the above-mentioned film on the polylactic acid bottles, too, to improve properties such as gas-barrier property.

Excellent gas-barrier property can be exhibited if the silicon oxide film is vapor-deposited on the PET bottles. If the silicon oxide film is vapor-deposited on the polylactic acid bottles, however, the walls of the polylactic acid bottles are thermally deformed and thermally deteriorated arousing a problem of generation of offensive odor in the bottles. The polylactic acid has a glass transition point lower than that of the PET, i.e., has an inferior heat resistance. If a silicon oxide film having gas-barrier property is vapor-deposited using a large plasma power, therefore, then the polylactic acid bottle cannot withstand the heat generated by the plasma at the time of deposition and, besides, undergoes the oxidation and deterioration due to the oxygen plasma produced during the step of vapor deposition.

Therefore, in the field of, specifically, packing, study has been forwarded to vapor-deposit films other than the silicon oxide film. For instance, patent documents 1 and 2 are proposing vapor-depositing a hydrocarbon film called diamond-like carbon (DLC) film on the inner surfaces of the polylactic acid bottles.

As compared to silicon oxide films, the hydrocarbon films can be vapor-deposited on the inner surfaces of the bottles requiring small outputs and in short periods of time without causing the polylactic acid bottles to be thermally deformed or thermally deteriorated yet providing a higher barrier property against water than that of the silicon oxide films, which are advantages. However, the hydrocarbon vapor-deposited film is hard and, besides, has no polar group; i.e., the hydrocarbon vapor-deposited film cannot be closely adhered to the polylactic acid base material such as polylactic acid bottle and tends to be easily delaminated. As described above, when it is attempted to vapor-deposit a hydrocarbon film on the polylactic acid base materials, there remains a problem of lack of close adhesion between the base material and the vapor-deposited film.

A patent document 3 proposes an art of vapor-depositing an organometal film (e.g., silicon oxide film) having an oxygen ratio that is suppressed to be low on the inner surface of a polylactic acid base material (e.g., polylactic acid bottle), and vapor-depositing a hydrocarbon film thereon. The thus vapor-deposited film of the two-layer structure has such advantages that the organometal film that is the lower layer is vapor-deposited with a small output making it possible to effectively prevent the polylactic acid base material from being thermally deteriorated or thermally deformed at the time of depositing the film and, at the same time, that the organometal film that is vapor-deposited has a low degree of oxidation and is, therefore, flexible enabling itself to be closely adhered to the polylactic acid base material. As a result, the delamination is effectively avoided and, besides, the hydrocarbon film that is vapor-deposited is allowed to exhibit its excellent properties to a sufficient degree.

However, the vapor-deposited film of the above two-layer structure involves such a defect that the reaction gas must be changed over during the step of depositing the film. Namely, changing over the reaction gas makes it difficult to maintain the continued deposition causing a decrease in the productivity and, therefore, requiring further improvements.

PRIOR ART DOCUMENTS

Patent Documents

Patent document 1: JP-A-2001-18290
Patent document 2: JP-A-2005-14966
Patent document 3: JP-A-2009-83511

OUTLINE OF THE INVENTION

Problems that the Invention is to Solve

It is, therefore, an object of the present invention to provide a polylactic acid formed body having a hydrocarbon film that is vapor-deposited on the surface of a polylactic acid base material highly and closely adheres to the polylactic acid base material and sufficiently exhibits the its own characteristic by a continuous plasma CVD step without the need of changing over the reaction gas and without causing the polylactic acid base material to be thermally deformed or thermally deteriorated, and a method of producing the same.

Means for Solving the Problems

According to the present invention, there is provided a polylactic acid formed body comprising a polylactic acid base material and a hydrocarbon film vapor-deposited on the surface of the base material by the plasma CVD method, wherein the polylactic acid base material exhibits a sharp X-ray diffraction peak in which a half-width of peak appearing in the 10°-25° wide angle X-ray measurement is not more than 1.22°, and the hydrocarbon film is vapor-deposited on the surface of the polylactic acid base material, and includes two layers of a high $CH_2$ layer having a ratio of $CH_2$ per the total of CH, $CH_2$ and $CH_3$ of not less than 40% and a low $CH_2$ layer formed on the high $CH_2$ layer and having a ratio of $CH_2$ per the total of CH, $CH_2$ and $CH_3$ of not more than 35%.

In the polylactic acid formed body of the present invention, it is desired that:

(1) The ratio of $CH_2$ in the high $CH_2$ layer is in a range of not less than 44% but less than 60%;
(2) The thickness of the high $CH_2$ layer is in a range of 5 to 15 nm and the thickness of the low $CH_2$ layer is in a range of 15 to 100 nm; and
(3) The formed body is a bottle.

Here, in the present invention, the ratio of $CH_2$ per the total of CH, $CH_2$ and $CH_3$ in the hydrocarbon vapor-deposited film is calculated by the FT-IR measurement. Concretely, upon taking the FT-IR measurement of the hydrocarbon vapor-deposited film, peaks stemming from CH, $CH_2$ and $CH_3$ appear in the region of wavenumbers of 3200 to 2600 $cm^{-1}$ and from these peaks, the ratio of $CH_2$ can be calculated. The method of calculation will be described later in Examples.

According to the present invention, further, there is provided a method of producing a polylactic acid formed body having a vapor-deposited film, comprising the step of feeding, as the reaction gas, a gas of at least one kind of hydrocarbon compound selected from aliphatic unsaturated hydrocarbons and aromatic hydrocarbons, and vapor-depositing a hydrocarbon film on the surface of a stretch-formed body of a polylactic acid by the plasma CVD, wherein the stretch-formed body of the polylactic acid exhibits a sharp X-ray diffraction peak in which a half-width of peak appearing in the 10°-25° wide angle X-ray measurement is not more than 1.22°, and in the step of vapor-depositing the hydrocarbon film, a plasma-treatment is conducted with a small output in the initial stage of forming the film to form a high $CH_2$ layer having a ratio of $CH_2$ per the total of CH, $CH_2$ and $CH_3$ of not less than 40% and, next, the plasma-treatment is conducted with a large output to form a low $CH_2$ layer having a ratio of $CH_2$ per the total of CH, $CH_2$ and $CH_3$ of not more than 35%.

In the production method of the present invention, it is desired that:

(1) The plasma-treatments with the small output and the large output are conducted by using microwaves;
(2) The plasma-treatment with the small output is conducted with the output of 350 to 600 W while the plasma-treatment with the large output is conducted with the output of 1000 to 1400 W;
(3) The plasma-treatment with the small output is conducted for 0.9 to 3.0 seconds while the plasma-treatment with the large output is conducted for 0.4 to 2.7 seconds;
(4) A trigger output of not less than 650 W is applied prior to conducting the plasma-treatment with the small output;
(5) The reaction gas having the same composition is fed throughout the plasma-treatment with the small output and the plasma-treatment with the large output; and
(6) The flow rate of the reaction gas is not substantially varied throughout the plasma-treatment with the small output and the plasma-treatment with the large output.

Effects of the Invention

The polylactic acid formed body of the present invention has a hydrocarbon film vapor-deposited on the surface of the polylactic acid base material (e.g., bottle), and has a feature in that the vapor-deposited film includes two layers of a high $CH_2$ layer having a high $CH_2$ ratio per the total of CH, $CH_2$ and $CH_3$ and a low $CH_2$ layer having a low $CH_2$ ratio, the high $CH_2$ layer being formed on the side of the polylactic acid base material and the low $CH_2$ layer being formed on the high $CH_2$ layer.

That is, as will be learned from that the vapor-deposited film is divided into two regions depending on their $CH_2$ ratios, the film of the two-layer structure can be vapor-deposited by a continuous step of vapor deposition by simply varying the output for plasma light emission at the time of vapor deposition by the plasma CVD without the need of changing over the reaction gas. The $CH_2$ ratio can be varied without the need of varying the composition of the reaction gas but by varying the output of the microwaves that affect the degree of decomposition of the hydrocarbon compound used as the reaction gas. In this case, there is no need of changing the flow rate of the reaction gas, either.

According to the present invention as described above, the vapor deposition is carried out by the continuous plasma CVD while continuously flowing a predetermined reaction gas at a predetermined flow rate featuring very high productivity, which is a great advantage of the present invention.

In the present invention, further, the hydrocarbon film is vapor-deposited in the two-layer structure as described above enabling the film to be very closely adhered to the polylactic acid base material, without developing delamination (film peeling) and permitting the hydrocarbon vapor-deposited film to exhibit its barrier property (e.g., water-barrier property) to a sufficient degree.

In the hydrocarbon vapor-deposited film of the above layer structure, the high $CH_2$ layer and the low $CH_2$ layer are both the hydrocarbon layers that are deposited without changing over the reaction gas and, therefore, the two layers do not peel off. Besides, the high $CH_2$ layer on the base material side works as an adhesive layer to maintain very close adhesion to the polylactic acid base material effectively preventing delamination (film peeling).

Namely, an increase in the $CH_2$ component in the hydrocarbon vapor-deposited film makes the film structure relatively loose imparting improved flexibility to follow deformation of the polylactic acid base material. Besides, the structure containing much $CH_2$ component can be formed by the plasma CVD with a small output. Therefore, the present inventors are considering that in conducting the vapor deposition, the polylactic acid serving as the base material is effectively prevented from being thermally decomposed, and very close adhesion is maintained between the high $CH_2$ layer and the polylactic acid base material. For example, the vapor-deposited film containing less $CH_2$ component is formed by the plasma CVD with a large output. At the time of depositing the film, therefore, a Cα carbon (branched carbon) portion is cut in the polylactic acid molecular chain that is forming the base material. As a result, affinity is lost between the vapor-deposited film and the polylactic acid, and close adhesion is not maintained.

Further, the low $CH_2$ layer formed on the high $CH_2$ layer works as a barrier layer and exhibits specifically excellent barrier property against water. That is, the amount of the $CH_2$ component that is small means that the branched structure is contained much and the film is dense. As a result, the low $CH_2$ layer exhibits excellent water-barrier property. Besides, in the present invention, the low $CH_2$ layer that works as a barrier layer is formed on the high $CH_2$ layer that is closely adhered to the polylactic acid base material, and is allowed to exhibit its excellent properties maintaining stability effectively preventing a decrease in the properties that may be caused by delamination or the like.

In the invention, the fact that the hydrocarbon vapor-deposited film formed on the surface of the polylactic acid base material includes two layers of dissimilar $CH_2$ ratios, can be easily identified by using an ultraviolet-visible ray spectrophotometer. That is, in the reflection spectra obtained by measurement based on the incident angle 0° reflection method over a spectral wavelength range of 300 to 900 nm, if an upwardly convex spectrum is exhibited over a range of 350 nm to 550 nm, then it means that the hydrocarbon vapor-deposited layer is a single layer (e.g., see FIG. 5) and if a downwardly convex spectrum is exhibited, then the film includes many layers (e.g., see FIG. 6). Thus if the film includes many layers or is a single layer can be simply identified by using the ultraviolet-visible ray spectrophotometer.

Further, the present invention effectively avoids the polylactic acid base material on which the above-mentioned hydrocarbon film has been vapor-deposited from being thermally deformed or thermally deteriorated. Namely, the polylactic acid base material used in the invention exhibits a sharp X-ray diffraction peak in which a half-width of peak appearing in the 10°-25° wide angle X-ray measurement is not more than 1.22°. This means that the polylactic acid base material has been stretch-formed, oriented and crystallized, and thermally set; i.e., the polylactic acid base material contains oriented crystals in increased amounts and has a high heat resistance with its thermal strain being relaxed. In addition to the heat resistance of the polylactic acid base material, the high $CH_2$ layer is vapor-deposited first with a small output and in a short period of time giving very little thermal shock to the polylactic acid base material. Further, the low $CH_2$ layer is vapor-deposited on the high $CH_2$ layer with a large output. In this case, however, the high $CH_2$ layer formed on the surface of the polylactic acid base material exhibits a heat-insulating function to protect the polylactic acid base material from the thermal shock. According to the present invention, therefore, the polylactic acid base material is effectively prevented from being thermally deformed or thermally deteriorated during the vapor deposition.

The polylactic acid formed body of the present invention provided with the hydrocarbon vapor-deposited film can be favorably used, specifically, in the field of packing and is, most desirably, used as bottles having a film vapor-deposited on the inner surfaces thereof.

BEST MODE FOR CARRYING OUT THE INVENTION

Figure 1:
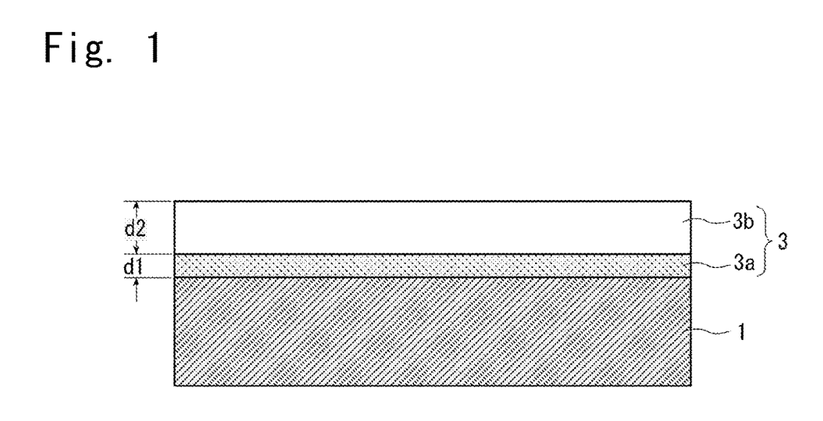
FIG. 1 is a view illustrating in cross section the structure of a polylactic acid formed body of the invention.

With reference to FIG. 1 illustrating in cross section the structure of a polylactic acid formed body of the invention, the formed body comprises a polylactic acid base material 1 and a hydrocarbon film 3 vapor-deposited on the surface thereof. Further, the vapor-deposited film 3 comprises a high $CH_2$ layer 3a formed on the surface of the polylactic acid base material 1 and a low $CH_2$ layer 3b formed on the high $CH_2$ layer 3a. In the example of FIG. 1, the film 3 is vapor-deposited on only one surface of the polylactic acid base material 1. The film 3, however, may be vapor-deposited on both surfaces thereof.

<Polylactic Acid Base Material 1>

Figure 2:
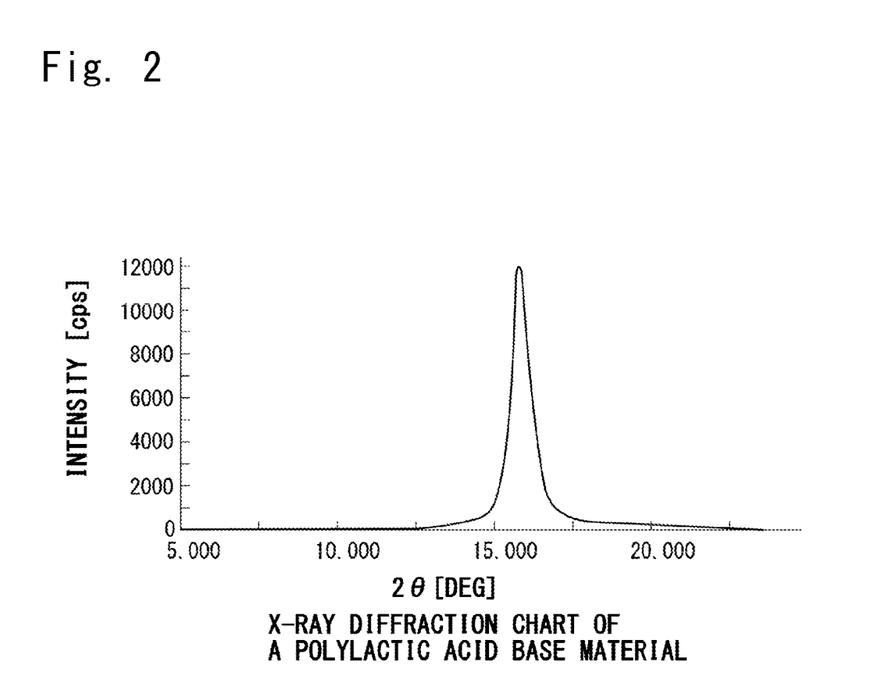
FIG. 2 is an X-ray diffraction chart of a polylactic acid base material (polylactic acid bottle) used in Example 1.

As shown in the X-ray diffraction chart of FIG. 2, the polylactic acid base material 1 used in the invention must exhibit a sharp X-ray diffraction peak in which a half-width of peak appearing in the 10°-25° wide angle X-ray measurement is not more than 1.22°. As described earlier, exhibition of such a sharp X-ray diffraction peak means that the polylactic acid base material 1 has been stretch-formed, i.e., is a formed body which has been oriented and crystallized due to heat-setting and stretch-forming, and has its thermal strain relaxed and has large heat resistance.

For example, if no X-ray diffraction peak appears in the wide angle X-ray measurement of 10°-25° or if the peak appears but is a broad peak with its half-value width exceeding 1.22° in the wide angle X-ray measurement of 10°-25°, then it means that the orientation and crystallization are not sufficient, heat-setting is not sufficient, heat resistance is very low, and that the polylactic acid base material 1 is thermally deformed or thermally deteriorated when the film 3 is vapor-deposited by a plasma CVD that will be described later. In the present invention, the stretch-forming and heat-setting have been effected to such a degree that there appears a sharp X-ray diffraction peak and that the polylactic acid base material 1 has an improved heat resistance making it possible to effectively prevent the polylactic acid base material from being thermally deformed or thermally deteriorated during the vapor-deposition of the film.

As the polylactic acid for forming the polylactic acid base material 1, further, there can be used either the poly-L-lactic acid or the poly-D-lactic acid, or there can be used a copolymer of the poly-L-lactic acid and the poly-D-lactic acid so far as it can be oriented and crystalized so as to exhibit the above-mentioned sharp X-ray diffraction peak. From the standpoint of heat resistance, there can be preferably used a poly-L-lactic acid copolymer containing less than 4% by weight of the poly-D-lactic acid which is an optical isomer.

There is no specific limitation on the form of the polylactic acid base material 1 so far as it has been stretch-formed and heat set so as to exhibit a sharp X-ray diffraction peak as described above. Namely, the polylactic acid base material 1 may assume any form such as film or sheet, or may be containers such as bottle, cup, tube and the like, or may assume the form of any other articles, and may take any form depending on the use.

In the present invention, the vapor-deposited film 3 described later exhibits excellent gas-barrier property and, particularly, water-barrier property. It is, therefore, specifically desired to vapor-deposit the film 3 that is described later on the surface (specifically, on the inner surface) of the bottle. The bottle can be obtained by forming a preform by extrusion forming or injection forming, subjecting the preform to the biaxial stretch-blow forming and, thereafter, bringing the preform into contact with a mold that has been heated at a predetermined temperature to heat-set the preform. The stretching ratio, the heat-set temperature (mold temperature) and the like may be so set that a sharp X-ray diffraction peak can be exhibited as described above.

The mold temperature, for instance, is set to lie in a range of not lower than a heat crystallization temperature of the polylactic acid but lower than a melting point thereof and, specifically, in a range of 80 to 100° C. Outside this range, the heat-setting may not be executed to a sufficient degree.

<Hydrocarbon Vapor-Deposited Film 3>

The hydrocarbon film 3 of a two-layer structure comprising the high $CH_2$ layer 3a and the low $CH_2$ layer 3b is vapor-deposited by a continuous plasma CVD using, as the reaction gas, a gas of a hydrocarbon compound that will be described below, e.g., by a glow discharge plasma CVD utilizing, for example, microwaves or high frequency waves. Namely, the high $CH_2$ layer 3a and the low $CH_2$ layer 3b can be formed by the continuous plasma CVD without changing the reaction gas species or the composition thereof.

When the high frequency waves are to be used, the polylactic acid base material 1 on which the film is to be formed must be held by a pair of electrode plates. When it is attempted to vapor-deposit the film 3 on the base material 1 of the shape of a solid container such as bottle, therefore, it is desired to execute the plasma CVD by using microwaves. Namely, to hold the container wall by the pair of electrode plates, the structure of the device tends to become complex. Use of microwaves, however, makes it possible to avoid such an inconvenience.

As the hydrocarbon compound used as the reaction gas for the plasma CVD, there can be used at least one of, for example, an aliphatic unsaturated hydrocarbon or an aromatic hydrocarbon.

As the aliphatic unsaturated hydrocarbon, there can be used alkenes such as ethylene, propylene, butene and pentene; alkynes such as acetylene and methylacetylene; alkadienes such as butadiene and pentadiene; and cycloalkenes such as cyclopentene and cyclohexene. As the aromatic hydrocarbon, there can be exemplified benzene, toluene, xylene, indene, naphthalene and phenanthrene. These compound gases may be used each in one kind or in a mixture of two or more kinds as the reaction gas. From the standpoint of film properties, the present invention preferably uses aliphatic unsaturated hydrocarbons and, most preferably, ethylene or acetylene.

As a diluent, further, a variety of carrier gases can be used together with the above reaction gas to adjust the concentration of the reaction gas. As the carrier gas, there can be exemplified such inert gases as argon gas and helium gas.

The plasma CVD will be described below with reference to the case of a bottle. For example, a polylactic acid bottle (polylactic acid base material 1) on which the film is to be formed is arranged in a chamber, the interior of the bottle is evacuated and is maintained in a predetermined degree of vacuum in which a plasma can be generated. By using a gas feed pipe, the above-mentioned reaction gas is fed into the bottle and microwaves of a predetermined output are fed therein by using a waveguide or the like to deposit the film by the plasma CVD.

When the film is to be deposited as above, it is desired to also maintain the exterior of the bottle in a suitable degree of vacuum by evacuation in the chamber in order to prevent the bottle from being deformed by a difference between the internal pressure and the external pressure.

When the film is to be deposited by the plasma CVD by feeding the reaction gas to the interior of the bottle as described above, there is no need of varying the flow rate of the reaction gas throughout the whole step. In the case of a bottle of a capacity of, for example, 520 ml, however, it is desired that the flow rate of the reaction gas is set in a range of 80 to 200 sccm. If the flow rate is too small, the energy becomes great per molecule during the deposition of film. During the deposition of the low $CH_2$ layer 3b that will be described later, in particular, the energy attacks deep into the lower layer and it becomes difficult to properly vapor-deposit the film causing the barrier property to become poor. If the flow rate is unnecessarily large, on the other hand, the energy becomes too small per a molecule and it becomes difficult to deposit the film itself.

Here, "sccm" is a unit of gas flow rate and is an abbreviation of "standard cc/min" under 1 atm (atmospheric pressure, 1.013 hPa) at 25° C.

It is, further, desired that the ratio (sccm/ml) of gas flow rate/volume of bottle is set to lie in a range of 0.27 to 0.38 throughout the whole step. If the ratio is too small, the output energy increases per a molecule of the reaction gas in the bottle, and the luminous intensity becomes too high causing the film to lose stability in the quality. If the ratio is too large, the output energy becomes small per a molecule of the reaction gas in the bottle, and the luminous intensity becomes low making it difficult to form, specifically, the low $CH_2$ layer 3b that has a high barrier property.

—High $CH_2$ layer 3a—

In the hydrocarbon film 3 that is vapor-deposited of the present invention, the high $CH_2$ layer 3a formed on the surface of the polylactic acid base material 1 works as the closely adhered layer and in which the ratio of $CH_2$ is not less than 40% and, preferably, in a range of not less than 44% but less than 60% per the total of CH, $CH_2$ and $CH_3$. Namely, as shown in the FT-IR chart of FIG. 3, the high $CH_2$ layer 3a formed by the plasma CVD by using the above reaction gas exhibits peaks due to CH, $CH_2$ and $CH_3$ in a region of wave numbers of 3200 to 2600 $cm^{-1}$. The high $CH_2$ layer 3a having the ratio of $CH_2$ to the total of CH, $CH_2$ and $CH_3$ in the above range, contains much $CH_2$ bond that has high flexibility, has little branched molecules in the film, has a loose structure, and is vapor-deposited with a small output suppressing the decomposition of polylactic acid molecules (specifically, suppressing the cleavage at the C α carbon portion). As a result, the high $CH_2$ layer 3a very closely adheres to the surface of the polylactic acid base material 1, works as a so-called closely adhered layer (or adhesive layer) and effectively prevents the delamination.

If, for example, the $CH_2$ ratio is smaller than the above range, the high $CH_2$ layer 3a has decreased flexibility, becomes less capable of following up the deformation of the polylactic acid base material 1, possesses decreased affinity to the surface of the polylactic acid base material 1, and cannot be deposited with a small output and, after all, cannot be closely adhered to the surface of the polylactic acid base material 1. If the $CH_2$ ratio is larger than the above range, on the other hand, then the film must be deposited with a further decreased output; i.e., it may become difficult to deposit the film.

It is desired that the high $CH_2$ layer 3a has a thickness d1 in a range of 5 to 15 nm. If the thickness is too large, the layer is colored to spoil the appearance of the polylactic acid base material 1 and lowers the commercial value. Besides, an increased thickness does not produce any further effects. If the thickness is too small, on the other hand, closely adhering property of the high $CH_2$ layer 3a cannot be effectively utilized, and it may become difficult to prevent the occurrence of delamination.

In the present invention, the high $CH_2$ layer 3a is deposited by the plasma CVD while flowing the above-mentioned reaction gas. Here, however, the high $CH_2$ layer 3a is deposited with a small output, and the emission of light may lose stability. To prevent such an inconvenience, it is desired that a large trigger output is applied prior to depositing the high $CH_2$ film 3a (i.e., at the start of the vapor deposition) to establish a stable plasma and, thereafter, to continue the vapor deposition with a small output.

Usually, the trigger output is set to be not less than 650 W in the case of the plasma CVD using microwaves. If the trigger output is too large, however, the surface of the polylactic acid base material 1 is thermally deteriorated to lose closely adhering property. It is, therefore, desired that the trigger output is in a range of not larger than 1300 W. Further, the trigger output may be applied only instantaneously, e.g., not longer than 10 msec. The triggering time which is long also causes the surface of the polylactic acid base material 1 to be thermally deteriorated and to lose closely adhering property.

After the trigger output is applied as described above, the film is deposited by the plasma CVD with a small output to form the high $CH_2$ layer 3a.

The output is in a range of 350 W to 600 W when the microwaves are used. If the output is smaller than this range, the emission of light loses stability or no light is emitted making it difficult to deposit the film. If the output is larger than the above range, on the other hand, the surface of the polylactic base material 1 is thermally deteriorated, the $CH_2$ ratio decreases, and the closely adhering property may be spoiled.

To have the thickness of the high $CH_2$ layer 3a lie in the above-mentioned range, the film may be deposited with the above small output, usually, for a period of 0.9 to 3.0 seconds.

—Low $CH_2$ layer 3b—

The low $CH_2$ layer 3b is formed on the high $CH_2$ layer 3a that is formed as described above, and works as a barrier layer and in which the $CH_2$ ratio per the total of CH, $CH_2$ and $CH_3$ is not more than 35% and, preferably, in a range of less than 31%. Namely, as shown in the FT-IR chart of FIG. 4, the low $CH_2$ layer 3b formed by the plasma CVD by using the above reaction gas, too, exhibits peaks due to CH, $CH_2$ and $CH_3$ in a region of wave numbers of 3200 to 2600 $cm^{-1}$. The ratio of $CH_2$ to the total of CH, $CH_2$ and $CH_3$ calculated from these peaks, is smaller than that of the high $CH_2$ layer 3a described above. Namely, the low $CH_2$ layer 3b is a dense and rigid film which cannot provide very closely adhering property and permits the delamination to occur.

According to the present invention, however, the high $CH_2$ layer 3a is vapor-deposited on the surface of the polylactic acid base material 1 using the same reaction gas and is very closely adhered thereto and on which the low $CH_2$ layer 3b is vapor-deposited. Therefore, the low $CH_2$ layer 3b is firmly held by the high $CH_2$ layer 3a effectively preventing the delamination.

Further, the layer having less $CH_2$ bond means that the film is much branched and is dense. It will, therefore, be learned that the low $CH_2$ layer 3b has high gas-barrier property and exhibits barrier property against, specifically, water.

If the $CH_2$ ratio exceeds the above range, the layer becomes loose and loses barrier property.

It is desired that the low $CH_2$ layer 3b has a thickness d2 in a range of 15 to 100 nm. If the thickness is too large, it becomes difficult to firmly hold the low $CH_2$ layer 3b relying only upon the closely adhering property of the high $CH_2$ layer 3a, and delamination tends to take place easily. If the thickness is too small, on the other hand, barrier property becomes insufficient against water and the like.

In the present invention, the low $CH_2$ layer 3b is continuously deposited following the deposition of the above high $CH_2$ layer 3a; i.e., deposition of the high $CH_2$ layer 3a can be changed over to the deposition of the low $CH_2$ layer by simply adjusting the output.

The output for forming the low $CH_2$ layer 3b is in a range of 1000 to 1400 W when the microwaves are used. If the output is smaller than this range, the $CH_2$ ratio increases. If the output is larger than the above range, on the other hand, the high $CH_2$ layer 3a is damaged and tends to be delaminated. In order for the thickness of the low $CH_2$ layer 3b to lie in the above-mentioned range, further, the film may be deposited with the above large output for a period of, usually, 0.4 to 2.7 seconds.

As described above, the present invention requires no cumbersome means such as changing over the reaction gas species, and makes it possible to deposit a film that closely adheres to the surface of the polylactic acid base plate 1. Besides, by forming the barrier layer on the closely adhered layer, it is allowed to vapor-deposit the hydrocarbon film 3 of the two-layer structure having excellent barrier property.

The present invention is very effective in the field of packaging containers such as bottles.

EXAMPLES

Examples 1 to 13, Comparative Examples 1 to 5, Control

By using an injection-forming machine, a poly-L-lactic acid resin (PLA) having a weight average molecular weight (Mw) of 200,000 and containing an optically active isomer (D-lactic acid) in amounts (% by weight) as shown in Table 3 was formed into preforms having bottom. The preforms were heated by using an external infrared-ray heater and were biaxially stretch-blow-formed by using a blow mold heated at temperatures shown in Table 3 to obtain polylactic acid bottles having a capacity of 520 ml.

Each of the obtained polylactic acid bottles was set in a plasma CVD apparatus, the interior of the bottle was evaluated down to a predetermined degree of vacuum, acetylene was used as the reaction gas to generate plasma therein using microwaves of 2.45 GHz, and a hydrocarbon film was vapor-deposited on the inner surface of the bottle under the conditions shown in Table 3 while flowing the gas at a rate of 160 sccm.

After the film has been deposited, the pressure therein was returned back to atmospheric pressure, the bottle was taken out from the plasma CVD apparatus, cooled, and was evaluated. The reaction gas of the same species was used and flown at the same flow rate from the start of vapor deposition until the end of vapor deposition. The film was vapor-deposited for a predetermined period of time while varying the output in order of trigger output, deposition of the high $CH_2$ layer and deposition of the low $CH_2$ layer. The trigger output time was 10 msec.

The polylactic acid bottles before depositing the film and the bottles after the film has been vapor-deposited were evaluated for their properties by the methods described below to obtain the results as shown in Table 3.
(Evaluating Methods)
<Measuring the X-Ray Half-Width>

A flat panel portion was cut out from the central part of the side wall of the stretch-blow-formed bottle of before depositing the film, was fitted to a square aperture of 20 mm×15 mm, and was measured by using a wide angle X-ray measuring apparatus (wide angle X-ray diffraction spectrometer, RINT 2000, manufactured by Rigaku Denki Co.) with a source of Cu—Kα ray (30 KV, 100 mA) to find a half-width of diffraction peak measured over a range of 2θ=10° to 25°.

FIG. 2 is an X-ray diffraction chart of the polylactic acid bottle used in Example 1.
<Measuring the Ratio of $CH_2$ in the Vapor-Deposited Layer>

The bottles for measuring the $CH_2$ ratios in the vapor-deposited layer were prepared by separately vapor-depositing the high $CH_2$ layer and the low $CH_2$ layer on the polylactic acid bottles on which no film has been deposited, under the plasma conditions of Examples and Comparative Examples shown in Table 3. Chloroform was introduced into the obtained bottles, shook, stirred, and was recovered and filtered through a 5A-filter paper. The deposited film remaining as a residue on the filter paper was washed and filtered with an excess amount of chloroform. The chloroform was dripped on a KRS-5 plate, dried, and was measured by using an infrared FR-IR microscope over a frequency range of 600 $cm^{-1}$ to 4000 $cm^{-1}$. The $CH_2$ ratios in the layers were found through the treatment described below to obtain results as shown in Table 3.

Of the spectra that were measured, a range of from 2600 $cm^{-1}$ to 3200 $cm^{-1}$ was used as a peak hydrocarbon absorption region, and a 2600 $cm^{-1}$ part and a 3200 $cm^{-1}$ part were connected together to form a base line.

Next, in compliance with the document of D. S. Patil et al., Journal of Alloys and Compounds, 78 (1998), 130-134, the following absorption bands:

$CH_3$ absorption band: 2960 $cm^{-1}$
$CH_2$ absorption band: 2925 $cm^{-1}$
$CH$ absorption band: 2915 $cm^{-1}$ were selected as absorption peaks in the asymmetric oscillation mode. Further, for easy separation of waveforms, there was, further, used an absorption band in the symmetric oscillation mode (mixed absorption band of $CH_2$ and $CH_3$): 2860 $cm^{-1}$ to attain the curve fitting. Used was a curve-fitting software equipped with an infrared FT-IR microscope.

The peak intensities (peak areas) of 2960 $cm^{-1}$ ($CH_3$), 2925 $cm^{-1}$ ($CH_2$) and 2915 $cm^{-1}$ ($CH$) in the asymmetric oscillation mode were each multiplied by the absorbency coefficients (2960 $cm^{-1}$: 0.31, 2925 $cm^{-1}$: 0.29, 2915 $cm^{-1}$: 0.14) of their respective peaks to obtain their respective peak intensity values (reference document: Polymer Analytical Handbook).

By using the corrected peak intensities obtained by being multiplied by the absorbency coefficients, the sum of ($CH_3$): 2960 $cm^{-1}$, ($CH_2$): 2925 $cm^{-1}$ and ($CH$): 2915 $cm^{-1}$ was regarded to be 100, and the composition ratio of the $CH_2$ structure was found according to the following formula. The $CH_2$ ratios were as shown in Table 3.

$$[CH_2\ ratio](\%)=(CH_2)\times 100/(CH+CH_2+CH_3)$$

Figure 3:
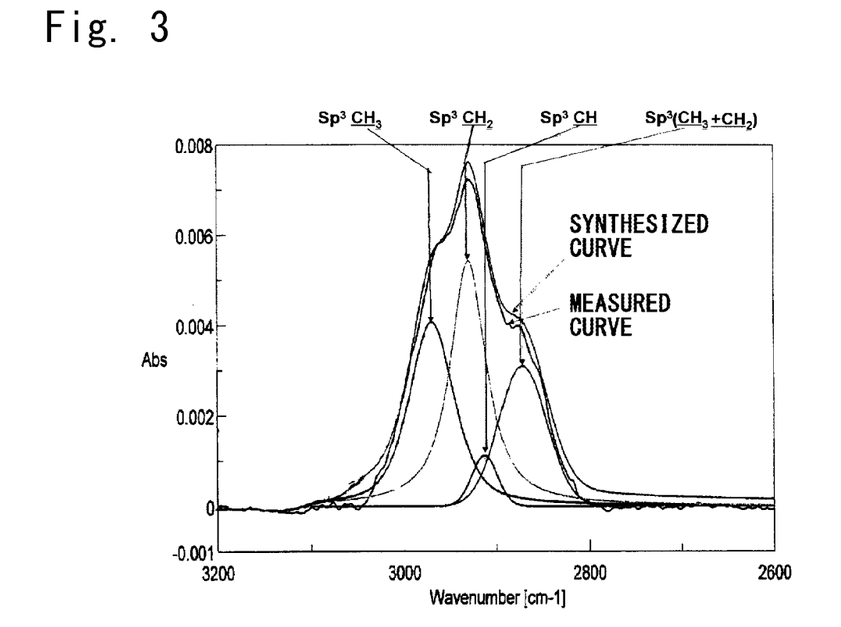
FIG. 3 is an FT-IR chart of the measurement of the high $CH_2$ layer in the film vapor-deposited on the surface of the polylactic acid base material (on the inner surface of the bottle) prepared in Example 1.
Figure 4:
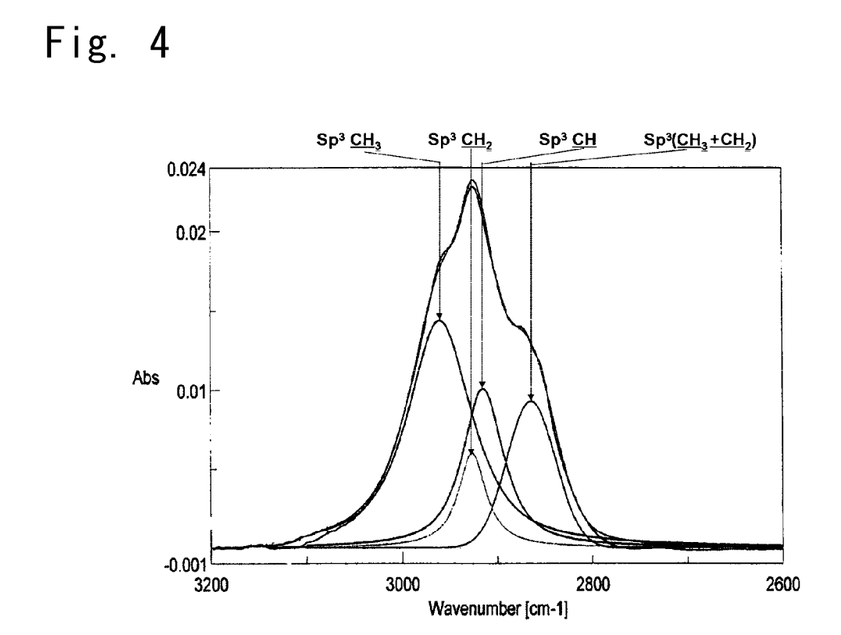
FIG. 4 is an FT-IR chart of the measurement of the low $CH_2$ layer in the film vapor-deposited on the surface of the polylactic acid base material (on the inner surface of the bottle) prepared in Example 1.

As analytical results of the film vapor-deposited in Example 1, FIG. 3 shows an FT-IR chart of the high $CH_2$ layer and FIG. 4 shows an FT-IR chart of the low $CH_2$ layer.
<Measuring the Thickness of the Vapor-Deposited Film>

The thickness of the film vapor-deposited on the inner surface of the polylactic acid bottle was measured by the UV-VIS reflection method. First, samples were prepared by vapor-depositing a single high $CH_2$ layer and a single low $CH_2$ layer on separate Si base plates, and were correctly measured for their film thicknesses by an oblique incident X-ray measuring method. Next, the samples were measured by the UV-VIS method. Parameters of a dielectric function model (Cauchy) were simulated, and values of film thicknesses found by the oblique incident X-ray measuring method were introduced to find an optical constant (refractive index n (λ)·extinction coefficient k(λ)). The optical constant is dependent upon the wavelength (λ). The unit of the wavelength (λ) is in nm. Coefficients of materials for finding calculation formulas and optical constants are shown in Tables 1 and 2 below.

In Tables 1 and 2, the closely adhered layer stands for the high $CH_2$ layer on the surface of the polylactic acid base plate (bottle) and the barrier layer stands for the low $CH_2$ layer on the closely adhered layer (high $CH_2$ layer).

TABLE 1

| <Refractive index> | | | |
| Refractive index $n(\lambda) = An + Bn/(\lambda^2) + Cn(\lambda^4)$ | | | |
|---|---|---|---|
| Output | Section | Coefficients of materials | | |
| (W) | | An | Bn | Cn |
| 1150 | barrier layer | 1.801 | 0.000 | 0.000 |
| 400 | closely adhered layer | 2.047 | 0.000 | 0.000 |

TABLE 2

| <Extinction coefficient> | | | |
| Extinction coefficient $k(\lambda) = Ak + Bk/(\lambda^2) + Ck(\lambda^4)$ | | | |
|---|---|---|---|
| Output | Section | Coefficients of materials | | |
| (W) | | Ak | Bk | Ck |
| 1150 | barrier layer | 0.000 | 0.000 | 0.002 |
| 400 | closely adhered layer | 0.000 | 0.191 | 0.022 |

The side walls of the bottles on which films were deposited in Examples and in Comparative Examples were measured for their UV-VIS reflection spectra by using an ultraviolet-visible spectrophotometer (Film-Tek 3000 SE manufactured by SCI Co.) to find the thicknesses of the barrier layers and the closely adhered layers relying on their optical constants described above by simulating the dielectric function models (Cauchy) attached to the spectrophotometer. The results were as shown in Table 3. Measurements were taken under the conditions of a source of white light, an Si reference, and a reflection method of an angle of incidence of 0 degree.

Figure 5:
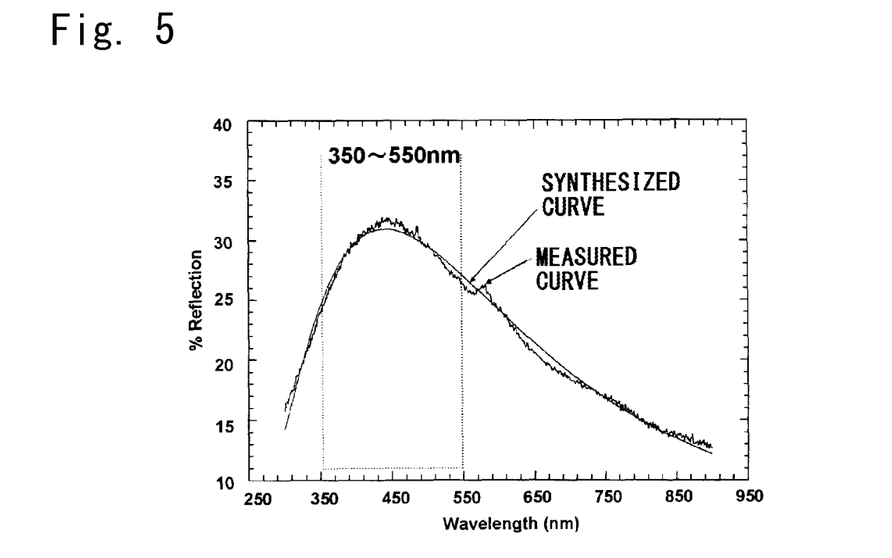
FIG. 5 shows a reflection spectrum of a single layer vapor-deposited on the surface of the polylactic acid base material (on the inner surface of the bottle) prepared in Comparative Example 1 as measured by using an ultraviolet-visible ray spectrophotometer.
Figure 6:
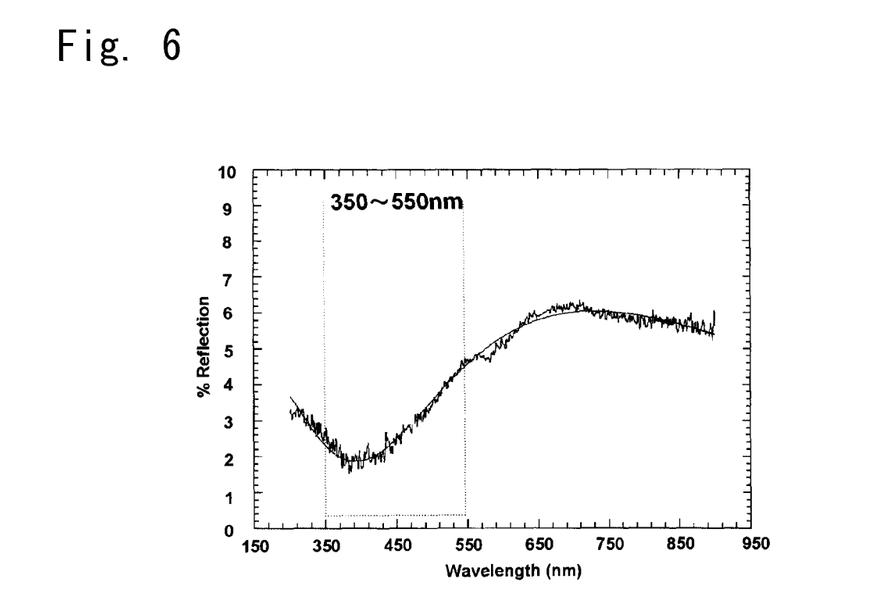
FIG. 6 shows a reflection spectrum of a two-layer film vapor-deposited on the surface of the polylactic acid base material (on the inner surface of the bottle) prepared in Example 1 as measured by using the ultraviolet-visible ray spectrophotometer.

FIG. 5 shows a reflection spectrum of the single film vapor-deposited in Comparative Example 1, and FIG. 6 shows a reflection spectrum of a two-layer film vapor-deposited in Example 1.

As will be understood from FIGS. 5 and 6, over the wavelength range of 350 nm to 550 nm, the single vapor-deposited film exhibits an upwardly convex spectral pattern (FIG. 5) while the two-layer vapor-deposited film comprising the high $CH_2$ layer and the low $CH_2$ layer exhibits a downwardly convex spectral pattern (FIG. 6).

<Resistance Against Thermal Deformation>

The polylactic acid bottles after the step of plasma CVD were observed for their body portions with the eye. The bottles that were recognized to have been deformed were evaluated on the following basis.

◯: Not deformed.

Δ: Slightly deformed but was acceptable.

x: Obviously deformed.

<Water Permeability>

Three polylactic acid bottles that were obtained were each filled with 500 ml of ion-exchanged water, sealed with a rubber plug, and were measured for their weights. These weights were regarded to be the initial weights. Next, the bottles were stored in an environment of 37° C.-RH30%. After 7 days have passed, the weights were measured again and were regarded to be the aged weights. Differences were calculated between the initial weights and the aged weights to find the water permeability ($g/m^2 \cdot day$) per the unit area of the bottle surface area and per a day.

<Resistance Against Delamination>

Three polylactic acid bottles that were obtained were each filled with 500 ml of ion-exchanged water, sealed with a rubber plug, and were stored in an environment of 37° C.-RH30%. After 90 days have passed, the bottles were taken out, shook 100 times, and the inner surfaces were observed with the eye from the exterior of the bottles. The vapor-deposited films were evaluated for their resistance against delamination based on the presence of transparent flakes (scraps of vapor-deposited films) scintillating in the bottles. The evaluation was based on the bottle that contained the scraps of vapor-deposited film most among the three bottles.

◯: No transparent flake was observed and no defective appearance was observed on the vapor-deposited film, either.

Δ: No transparent flake was observed but island-patterned discoloration occurred on the vapor-deposited film.

x: Transparent flakes were observed.

<Anti-Tinting Property>

Body portions of the obtained polylactic acid bottles were cut in a size of 10 mm×30 mm, and were measured for their color differences by using an ultraviolet-visible spectrophotometer manufactured by Nihon Bunkosha Co. to find their b* values.

TABLE 3

| No. | Forming conditions | | | | | | | Features of bottle | | | | | Evaluated results | | | |
|---|---|---|---|---|---|---|---|---|---|---|---|---|---|---|---|---|
| | *1 | *2 | *3 | *4 | *5 | *6 | *7 | *8 | *9 | *10 | *11 | *12 | *13 | *14 | *15 | *16 |
| Ex. 1 | 2.0 | 85 | 650 | 400 | 1.5 | 1150 | 1.0 | 0.65 | 53 | 29 | 9 | 31 | ◯ | 3.2 | ◯ | 10 |
| 2 | 3.9 | 90 | 650 | 400 | 1.5 | 1150 | 1.0 | 1.22 | 53 | 29 | 9 | 31 | Δ | 3.3 | ◯ | 10 |
| 3 | 2.5 | 85 | 650 | 400 | 1.5 | 1150 | 1.0 | 0.79 | 53 | 29 | 9 | 31 | ◯ | 3.2 | ◯ | 10 |
| 4 | 2.0 | 85 | 650 | 600 | 1.5 | 1150 | 1.0 | 0.65 | 40 | 29 | 13 | 31 | ◯ | 3.3 | Δ | 12 |
| 5 | 2.0 | 85 | 650 | 500 | 1.5 | 1150 | 1.0 | 0.65 | 44 | 29 | 11 | 31 | ◯ | 3.4 | ◯ | 11 |
| 6 | 2.0 | 85 | 650 | 350 | 3.0 | 1150 | 1.0 | 0.65 | 59 | 29 | 6 | 31 | ◯ | 3.6 | ◯ | 7 |
| 7 | 2.0 | 85 | 650 | 400 | 1.5 | 1000 | 1.0 | 0.65 | 53 | 35 | 9 | 26 | ◯ | 3.6 | ◯ | 10 |
| 8 | 2.0 | 85 | 650 | 400 | 1.5 | 1100 | 1.0 | 0.65 | 53 | 30 | 9 | 29 | ◯ | 3.4 | ◯ | 10 |
| 9 | 2.0 | 85 | 650 | 400 | 1.5 | 1400 | 1.0 | 0.65 | 53 | 5 | 9 | 49 | ◯ | 2.4 | ◯ | 12 |
| 10 | 2.0 | 85 | 650 | 400 | 0.9 | 1150 | 1.0 | 0.65 | 53 | 29 | 5 | 31 | ◯ | 3.4 | ◯ | 7 |
| 11 | 2.0 | 85 | 650 | 400 | 3.0 | 1150 | 1.0 | 0.65 | 53 | 29 | 15 | 31 | ◯ | 3.3 | ◯ | 12 |
| 12 | 2.0 | 85 | 650 | 400 | 1.5 | 1150 | 0.4 | 0.65 | 53 | 29 | 9 | 15 | ◯ | 3.9 | ◯ | 9 |
| 13 | 2.0 | 85 | 650 | 400 | 1.5 | 1150 | 2.7 | 0.65 | 53 | 29 | 9 | 100 | ◯ | 2.1 | ◯ | 17 |
| Comp. Ex. 1 | 2.0 | 85 | no | no | no | 1150 | 1.0 | 0.65 | no | 29 | no | 31 | ◯ | *17 | X | 4 |
| 2 | 2.0 | 85 | 650 | 400 | 1.5 | no | no | 0.65 | 53 | no | 9 | no | ◯ | 14.6 | ◯ | 7 |
| 3 | 2.5 | 20 | 650 | 400 | 1.5 | 1150 | 1.0 | 1.28 | 53 | 29 | 9 | 31 | X | *17 | X | 10 |
| 4 | 2.0 | 85 | no | 700 | 1.5 | 1150 | 1.0 | 0.65 | 37 | 29 | 15 | 31 | ◯ | *17 | X | 12 |
| 5 | 2.0 | 85 | 650 | 400 | 1.5 | 900 | 1.0 | 0.65 | 53 | 37 | 9 | 18 | ◯ | 5.4 | ◯ | 9 |
| Control | 2.0 | 85 | no | no | no | no | no | 0.65 | no | no | no | no | ◯ | 15.0 | — | — |

*1: D-lactic acid amount (%),
*2: Mold temp. (° C.),
*3: Hi CH2 layer trigger output (W),
*4: High CH2 layer output (W),
*5: High CH2 layer treating time (sec),
*6: Low CH2 layer output (W),
*7: Low CH2 layer treating time (sec),
*8: X-ray half-width (°),
*9: CH2 ratio in High CH2 layer (%),
*10: CH2 ratio in Low CH2 layer (%),
*11: Thickness of High CH2 layer (nm),
*12: Thickness of Low CH2 layer (nm),
*13: Heat deformation resistance,
*14: Water permeability (g/m2 · day),
*15: Delamination resistance.
*16: Anti-tinting (b* value)
*17: Delamination

DESCRIPTION OF REFERENCE NUMERALS

1: polylactic acid base material
3: hydrocarbon vapor-deposited film
3a: high $CH_2$ layer
3b: low $CH_2$ layer

The invention claimed is:

1. A polylactic acid formed body comprising a polylactic acid base material and a hydrocarbon film vapor-deposited on the surface of the base material by a plasma CVD method, wherein
   said polylactic acid base material exhibits a sharp X-ray diffraction peak in which a half-width of diffraction peak measured over a range of $2\theta=10°$ to $25°$ in a wide angle X-ray measurement with a source of Cu—K$\alpha$ ray (30 kV, 100 mA) is not more than 1.22°, and
   said hydrocarbon film is vapor-deposited on the surface of the polylactic acid base material, and includes two layers of a high $CH_2$ layer having a ratio of $CH_2$ per the total of CH, $CH_2$ and $CH_3$ of not less than 40% and a low $CH_2$ layer formed on said high $CH_2$ layer and having a ratio of $CH_2$ per the total of CH, $CH_2$ and $CH_3$ of not more than 35%.

2. The polylactic acid formed body according to claim 1, wherein the ratio of $CH_2$ in said high $CH_2$ layer is in a range of not less than 44% but less than 60%.

3. The polylactic acid formed body according to claim 1, wherein the thickness of said high $CH_2$ layer is in a range of 5 to 15 nm and the thickness of said low $CH_2$ layer is in a range of 15 to 100 nm.

4. The polylactic acid formed body according to claim 1, wherein said formed body is a bottle.

5. A method of producing a polylactic acid formed body having a vapor-deposited film, comprising the step of feeding, as the reaction gas, a gas of at least one kind of hydrocarbon compound selected from aliphatic unsaturated hydrocarbons and aromatic hydrocarbons, and vapor-depositing a hydrocarbon film on the surface of a stretch-formed body of a polylactic acid by a plasma CVD, wherein
   said stretch-formed body of the polylactic acid exhibits a sharp X-ray diffraction peak in which a half-width of diffraction peak measured over a range of $2\theta=10°$ to $25°$ in a wide angle X-ray measurement with a source of Cu—K$\alpha$ ray (30 kV, 100 mA) is not more than 1.22°, and
   in the step of vapor-depositing said hydrocarbon film, a plasma-treatment is conducted with a small output in the initial stage of forming the film to form a high $CH_2$ layer having a ratio of $CH_2$ per the total of CH, $CH_2$ and $CH_3$ of not less than 40% and, next, the plasma-treatment is conducted with a large output to form a low $CH_2$ layer having a ratio of $CH_2$ per the total of CH, $CH_2$ and $CH_3$ of not more than 35%,
   the plasma-treatment with the small output and the large output is conducted by using microwaves, and the plasma-treatment with the small output is conducted with the output of 350 to 600 W while the plasma-treatment with the large output is conducted with the output of 1000 to 1400 W.

6. The method of production according to claim 5, wherein the plasma-treatment with the small output is conducted for 0.9 to 3.0 seconds while the plasma-treatment with the large output is conducted for 0.4 to 2.7 seconds.

7. The method of production according to claim 5, wherein a trigger output of not less than 650 W is applied prior to conducting the plasma-treatment with the small output.

8. The method of production according to claim 5, wherein the reaction gas having the same composition is fed throughout the plasma-treatment with the small output and the plasma-treatment with the large output.

9. The method of production according to claim 5, wherein the flow rate of the reaction gas is not substantially varied throughout the plasma-treatment with the small output and the plasma-treatment with the large output.

* * * * *